United States Patent [19]

Beaudet et al.

[11] Patent Number: 4,599,527
[45] Date of Patent: Jul. 8, 1986

[54] DEVICE FOR STABILIZING GAIN OF A PHOTOSENSITIVE AVALANCHE MEMBER

[75] Inventors: Didier M. Beaudet; Pierre Nicole, both of Paris, France

[73] Assignee: Societe Anonyme de Telecommunications, Paris, France

[21] Appl. No.: 530,647

[22] Filed: Sep. 9, 1983

[30] Foreign Application Priority Data

Sep. 14, 1982 [FR] France .................. 82 15479

[51] Int. Cl.$^4$ ............................................. G05F 3/16
[52] U.S. Cl. ...................... 307/310; 307/297; 323/907; 250/214 AG
[58] Field of Search ............ 307/297, 310, 491, 493, 307/502; 323/907; 328/3; 330/59, 143; 250/214 AG, 214 C

[56] References Cited

U.S. PATENT DOCUMENTS

| 3,363,105 | 1/1968 | Dixon | 250/214 C |
|---|---|---|---|
| 3,992,622 | 11/1976 | Numata et al. | 307/491 X |
| 4,092,069 | 5/1978 | Fukuda et al. | 250/214 AG X |
| 4,153,835 | 5/1979 | Lau et al. | 250/214 C |
| 4,236,069 | 11/1980 | Laughlin | 250/214 AG |
| 4,292,514 | 9/1981 | Ohtomo | 250/214 C |
| 4,438,348 | 3/1984 | Casper et al. | 250/214 C X |
| 4,479,708 | 10/1984 | Tokuda | 307/491 X |

FOREIGN PATENT DOCUMENTS

| 2149440 | 4/1972 | Fed. Rep. of Germany ... 250/214 C |
|---|---|---|
| 2490404 | 3/1982 | France . |
| 0006727 | 1/1979 | Japan .................. 250/214 C |

Primary Examiner—Stanley D. Miller
Assistant Examiner—D. R. Hudspeth
Attorney, Agent, or Firm—Lowe Price LeBlanc Becker & Shur

[57] ABSTRACT

Gain of a photosensitive avalanche member, such as an avalanche photodiode, is stabilized so that a variation in gain of the photosensitive member in terms of temperature is compensated for by applying to the photosensitive member a bias voltage varying with temperature according to a predetermined relationship. The relationship depends on the variation with temperature in the voltage applied to terminals of at least one diode. The gain stabilizing device comprises a temperature-stabilized voltage source, a dc-dc voltage converter having an adjustable gain for applying a bias voltage to the photosensitive member, and at least one diode series-connected between the supply source and an input of the converter.

7 Claims, 1 Drawing Figure

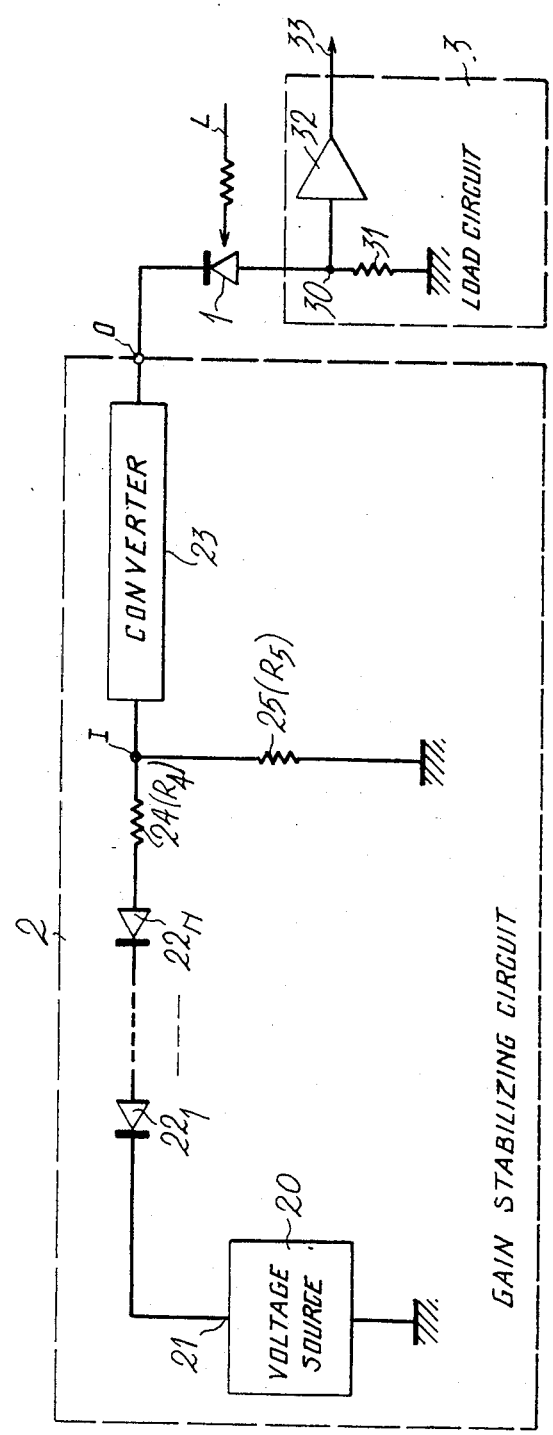

DEVICE FOR STABILIZING GAIN OF A PHOTOSENSITIVE AVALANCHE MEMBER

BACKGROUND OF THE INVENTION

1. Field of the Invention

This invention relates to optical receivers receiving signals via optical mediums such as optical fibers. More particularly, the invention deals with the gain stabilization of a photosensitive avalanche member such as an avalanche photodiode. 2. Description of the Prior Art Avalanche photodiodes ensure, for example, the photodetection of optical signals transmitted via optical fibers. The avalanche photodiodes are used, usually, because they have high signal-to-noise ratio associated with a significant gain. The gain of an avalanche photodiode is dependent on the reverse-bias voltage, also known as avalanche voltage.

Having said this, avalanche photodiodes do, however, have somewhat unstable characteristic curves. In particular, for a given received optical power, the photodetected current varies with temperature. Other causes of instability can also stem from accidental overloading or aging.

Methods for stabilizing the gain of an avalanche photodiode have already been disclosed.

A known method consists of placing the photodiode in a thermostatically-controlled housing. The stabilization achieved is however imperfect since the stabilization does not take account of the temperature difference that can exist between the photodiode active zone and the photodiode box. Indeed, the thermal energy given off by the photodiode due to current flow in the active zone is far from negligible.

Another known method consists of adjusting the photodiode gain through correction of the bias voltage applied to the photodiode. According to French patent application No. 2,490,404, the bias voltage is corrected indirectly via a control loop including a voltage comparator and an adjustable voltage source.

OBJECTS OF THE INVENTION

The main object of the invention is to correct gain of a photosensitive avalanche member through the insertion of electronic components providing direct correction of the avalanche voltage of the photosensitive member.

Another object of the invention is to provide an apparatus for stabilizing gain of a photosensitive avalanche member wherein a variation in gain of the photosensitive member in terms of temperature is compensated by applying to the photosensitive member a bias voltage varying with temperature according to a predetermined relationship.

A further object of the invention is to provide a device for stabilizing gain of a photosensitive avalanche member, comprising temperature-stabilized voltage supply means, voltage converting means having an output applying a bias voltage to the photosensitive member, and at least one diode series-connected between said voltage supply means and an input of the voltage converting means.

BRIEF DESCRIPTION OF THE DRAWING

The foregoing and other objects and advantages of this invention will be apparent from the following more particular description of preferred embodiments of the invention as illustrated in the sole corresponding accompanying FIGURE which is a block diagramm of a gain stabilizing circuit and a load circuit for an avalanche photodiode.

DESCRIPTION OF THE PREFERRED EMBODIMENTS

In reference to the FIGURE, a photodiode 1 is reverse-biased to operate under valanche. The cathode of photodiode 1 is connected to an output O of a gain stabilizing circuit 2 embodying the invention. The anode of photodiode 1 is connected to an input 30 of a load circuit 3.

The gain statibizing circuit 2 includes a low voltage source 20 temperature stabilized by means, for example, of a Zener diode. The positive terminal 21 of the dc voltage source 20 derives a temperature-stabilized low bias voltage $V_B$ of approximately 10 to 20 Volts. In circuit 2, the source terminal 21 is connected to N conventional diodes $22_1$ to $22_N$ connected in series and reverse-biased. The voltage at the terminals of each diode $22_1$ to $22_N$ is designated by $V_D$.

The gain stabilizing circuit 2 further comprises a dc-dc voltage converter 23, also known as a low voltage-to-high voltage converter. Input I of the converter 23 is connected to the anode of diode $22_N$ across a resistor 24 as well as to a grounded terminal via an input resistor 25. The resistances $R_4$ and $R_5$ of resistors 24 and 25 as well as the number N of diodes $22_1$ to $22_N$ are determined in terms of the equations set forth herebelow. The gain G of the converter 23 is given by the ratio $V_O/V_I$, where $V_O$ designates the output voltage at terminal O combined with the output of the converter 23, and $V_I$ designates the converter input voltage at terminal I. As a result, $V_O$ represents the bias voltage on the avalanche photodiode 1 to be temperature stabilized. The voltage $V_O$ is high, usually around 100 to 200 Volts, thereby justifying the inclusion of the voltage converter 23.

The load circuit 3 in accordance with the illustrated embodiment is of the conventional type. Circuit 3 comprises a resistor 31 between the terminal 30 and a grounded terminal, and a high impedance amplifier 32 between the terminal 30 and an output terminal 33. In another embodiment, not illustrated, the load circuit can be used in transimpedance and be made up of an amplifier having a negative gain, connected to a feedback loop including a load resistor for photocurrent measurement. In both embodiments, the voltage measured between the terminals of the load resistor, such as resistor 31, is proportional to the photocurrent provided by the photodiode 1 when photodiode 1 is illuminated by a light beam L.

The bias voltage $V_O$ of the avalanche photodiode 1 is given by Equation (1):

$$V_O = GR_5/(R_4+R_5)(V_B-NV_D) \tag{1}$$

deduced from the equations:

$$V_O = GV_I$$

and $$V_I = R_5/(R_4+R_5)(V_B - NV_D)$$

Since the voltage source 20 is temperature stabilized, the voltage $V_I$ depends only on the voltage $V_D$ at the terminals of each of diodes $22_1$ to $22_N$. As known, the voltage $V_D$ varies in proportion to the temperature as expressed by the equation:

$$V_D = kT/q \cdot \log(I/I_{sat} + 1)$$

where k is Boltzmann's constant, T is the absolute temperature, q is the electron charge, I is the current flowing through the diodes $22_1$ to $22_N$ and $I_{sat}$ is the diode saturation current.

Let $\alpha_D = (\Delta T_D/\Delta T)$ be the negative temperature coefficient for the voltage $V_D$ at the terminals of each diode $22_1$ to $22_N$, and let $\alpha_O = (\Delta V_O/\Delta T)$ be the positive temperature coefficient for the voltage $V_O$. To obtain a constant intrinsic gain of the photodiode 1 independent of the temperature, the photodiode bias voltage $V_O$ must vary in terms of the variation in the voltage at the terminals of diodes $22_1$ to $22_N$ as indicated in Equation (1). Now, because $\alpha_D$, $R_5$, G and $\alpha_O$ are parameters given by the manufacturer of the diodes, converter and photodiode, the resistance $R_4$ of resistor 24 can be deduced by deriving from Equation (1), whence:

$$(\Delta V_0/\Delta T) = -\frac{N G R_5}{(R_4 + R_5)} (\Delta V_D/\Delta T) \quad (2)$$

i.e. $R_4 = -R_5(1 - NG \alpha_D/\alpha_0)$

Equation (2) is valid insofar as the gain G of converter 23 remains constant. For this purpose, converter 23 is chosen as having a temperature-stabilized supply voltage.

By way of an example, for $\alpha_O = 0.4$ V/°K., $\alpha_D = -2.25$ mV/°K., $G = 100$, $R_5 = 20$ kΩ and $N = 3$, equation (2) gives $R_4 = 13.75$ kΩ.

Consequently, the choice of the values for the members in the stabilizing circuit 2 and the inclusion of diodes $22_1$ to $22_N$ in the circuit 2 make it possible to compensate for the avalanche photodiode gain perfectly under the effect of temperature variations.

In another embodiment, the converter 2 is a voltage converter having an adjustable gain G such that the value G can be adjusted for a given resistance $R_4$ in terms of Equation (2). In particular, when the resistance $R_4$ of the resistor 24 is chosen equal to zero, the gain G according to Equation (1) represents the voltage conversion gain with respect to a voltage supply means comprising the source 20 and the diodes $22_1$ to $22_N$.

Although the illustrated embodiment deals with an avalanche photodiode, the gain stabilizing circuit can be utilized for any other photosensitive avalanche member such as an avalanche phototransistor.

What we claimed is:

1. A device for stabilizing gain of a photosensitive avalanche member, comprising supply means for deriving a temperature-stabilized voltage, at least one diode series-connected to the supply means, and voltage converting means for converting a temperature-varying voltage derived from said diode into a bias voltage, said converting means being connected to apply said bias voltage to said photosensitive member.

2. The device claimed in claim 1 wherein said voltage converting means comprises a dc-dc voltage converter having one input connected to the diode and a resistor connected to a grounded terminal.

3. The device claimed in claim 2 wherein said voltage converting means comprises a resistor series-connected between said input of said voltage converter and said diode.

4. The device claimed in claim 2 wherein said voltage converter has an adjustable gain.

5. The device claimed in claim 3 wherein said voltage converter has an adjustable gain.

6. A device for stabilizing gain of a photosensitive avalanche member, comprising supply means for deriving a temperature-stabilized voltage, at least one diode having a cathode connected to said supply means to be responsive to said temperature-stabilized voltage, a first resistor having a terminal connected to an anode of said diode, a second resistor having a grounded terminal, and voltage converting means connected to other terminals of said first and second resistors for applying a bias voltage to said photosensitive member.

7. A device for stabilizing gain of a photosensitive avalanche member, comprising supply means for deriving a temperature-stabilized voltage, diode means connected to said supply means to be responsive to said temperature-stabilized voltage for deriving a temperature-varying voltage, and voltage converting means connected to said diode means to respond to said temperature-varying voltage for biasing said photosensitive member with a bias voltage varying as a function of said temperature-varying voltage.

* * * * *